(12) United States Patent
Shen et al.

(10) Patent No.: US 10,256,177 B2
(45) Date of Patent: Apr. 9, 2019

(54) INTEGRATED INTERPOSER SOLUTIONS FOR 2D AND 3D IC PACKAGING

(71) Applicant: INVENSAS CORPORATION, San Jose, CA (US)

(72) Inventors: Hong Shen, Palo Alto, CA (US); Charles G. Woychik, San Jose, CA (US); Arkalgud R. Sitaram, Cupertino, CA (US); Guilian Gao, San Jose, CA (US)

(73) Assignee: INVENSAS CORPORATION, San Jose, CA (US)

( * ) Notice: Subject to any disclaimer, the term of this patent is extended or adjusted under 35 U.S.C. 154(b) by 0 days.

(21) Appl. No.: 15/651,826

(22) Filed: Jul. 17, 2017

(65) Prior Publication Data

US 2017/0317019 A1 Nov. 2, 2017

Related U.S. Application Data

(62) Division of application No. 14/586,580, filed on Dec. 30, 2014, now Pat. No. 9,741,649.

(Continued)

(51) Int. Cl.
*H01L 23/10* (2006.01)
*H01L 23/13* (2006.01)
(Continued)

(52) U.S. Cl.
CPC ...... *H01L 23/49827* (2013.01); *H01L 21/486* (2013.01); *H01L 21/56* (2013.01);
(Continued)

(58) Field of Classification Search
CPC ............ H01L 23/49827; H01L 21/486; H01L 23/3107; H01L 23/3121; H01L 2924/15153
See application file for complete search history.

(56) References Cited

U.S. PATENT DOCUMENTS 4,825,921 A 5/1989 Rigter
5,532,519 A 7/1996 Bertin et al.
(Continued)

FOREIGN PATENT DOCUMENTS

EP 1688994 A1 8/2008
EP 2546876 A1 1/2013
(Continued)

OTHER PUBLICATIONS

International Search Report dated Sep. 21, 2015 for International Application No. PCT/US2015/033786, International Filing Date Feb. 6, 2015.

(Continued)

*Primary Examiner* — Ngan V Ngo
(74) *Attorney, Agent, or Firm* — Haynes and Boone, LLP (57) ABSTRACT

An integrated circuit (IC) package includes a first substrate having a backside surface and a top surface with a cavity disposed therein. The cavity has a floor defining a front side surface. A plurality of first electroconductive contacts are disposed on the front side surface, and a plurality of second electroconductive contacts are disposed on the back side surface. A plurality of first electroconductive elements penetrate through the first substrate and couple selected ones of the first and second electroconductive contacts to each other. A first die containing an IC is electroconductively coupled to corresponding ones of the first electroconductive contacts. A second substrate has a bottom surface that is sealingly attached to the top surface of the first substrate, and a dielectric material is disposed in the cavity so as to encapsulate the first die.

20 Claims, 8 Drawing Sheets

Related U.S. Application Data (60) Provisional application No. 62/007,758, filed on Jun. 4, 2014.

(51) Int. Cl.
*H01L 23/14* (2006.01)
*H01L 23/31* (2006.01)
*H01L 25/16* (2006.01)
*H01L 23/498* (2006.01)
*H01L 23/538* (2006.01)
*H01L 25/065* (2006.01)
*H01L 21/48* (2006.01)
*H01L 21/56* (2006.01)
*H01L 23/00* (2006.01)

(52) U.S. Cl.
CPC ............. *H01L 23/10* (2013.01); *H01L 23/13* (2013.01); *H01L 23/3107* (2013.01); *H01L 23/3121* (2013.01); *H01L 23/49838* (2013.01); *H01L 23/5384* (2013.01); *H01L 23/5389* (2013.01); *H01L 24/97* (2013.01); *H01L 25/0652* (2013.01); *H01L 25/162* (2013.01); *H01L 23/147* (2013.01); *H01L 23/3128* (2013.01); *H01L 23/49816* (2013.01); *H01L 25/0655* (2013.01); *H01L 2224/16227* (2013.01); *H01L 2224/16235* (2013.01); *H01L 2224/32225* (2013.01); *H01L 2224/73204* (2013.01); *H01L 2224/73253* (2013.01); *H01L 2224/81815* (2013.01); *H01L 2224/92125* (2013.01); *H01L 2224/92225* (2013.01); *H01L 2224/97* (2013.01); *H01L 2924/157* (2013.01); *H01L 2924/15153* (2013.01); *H01L 2924/15311* (2013.01); *H01L 2924/15788* (2013.01); *H01L 2924/167* (2013.01); *H01L 2924/16195* (2013.01); *H01L 2924/16788* (2013.01); *H01L 2924/181* (2013.01)

(56) References Cited

U.S. PATENT DOCUMENTS

| | | |
|---|---|---|
| 5,701,233 A | 12/1997 | Carson et al. |
| 6,008,536 A | 12/1999 | Mertol |
| 6,157,076 A | 12/2000 | Azotea et al. |
| 6,222,722 B1 | 4/2001 | Fukuzumi et al. |
| 6,251,796 B1 | 6/2001 | Abdul-Ridha et al. |
| 6,322,903 B1 | 11/2001 | Siniaguine et al. |
| 6,384,473 B1 | 5/2002 | Peterson et al. |
| 6,403,444 B2 | 6/2002 | Fukuzumi et al. |
| 6,451,650 B1 | 9/2002 | Lou |
| 6,492,726 B1 | 12/2002 | Quek et al. |
| 6,548,330 B1* | 4/2003 | Murayama ............. H01L 23/24 257/686 |
| 6,613,672 B1 | 9/2003 | Wang et al. |
| 6,620,701 B2 | 9/2003 | Ning |
| 6,624,505 B2 | 9/2003 | Badehi |
| 6,717,254 B2 | 4/2004 | Siniaguine |
| 6,746,876 B2 | 6/2004 | Itoh et al. |
| 6,787,916 B2 | 9/2004 | Halahan |
| 6,847,103 B1* | 1/2005 | Perez ................ H01L 21/4842 257/666 |
| 6,947,275 B1 | 9/2005 | Anderson et al. |
| 6,958,285 B2 | 10/2005 | Siniaguine |
| 7,011,988 B2 | 3/2006 | Forcier |
| 7,049,170 B2 | 5/2006 | Savastiouk et al. |
| 7,061,102 B2 | 6/2006 | Eghan et al. |
| 7,115,988 B1 | 10/2006 | Hool |
| 7,144,745 B2 | 12/2006 | Badehi |
| 7,183,643 B2 | 2/2007 | Gibson et al. |
| 7,186,586 B2 | 3/2007 | Savastiouk et al. |
| 7,400,036 B2 | 7/2008 | Tan |
| 7,670,921 B2 | 3/2010 | Chinthakindi et al. |
| 7,786,591 B2 | 8/2010 | Khan et al. |
| 7,906,803 B2 | 3/2011 | Shiova et al. |
| 7,928,548 B2 | 4/2011 | Bernstein et al. |
| 7,964,508 B2 | 6/2011 | Savastiouk et al. |
| 7,977,579 B2 | 7/2011 | Bathan et al. |
| 7,989,270 B2 | 8/2011 | Huang et al. |
| 8,018,068 B1 | 9/2011 | Scanlan et al. |
| 8,071,470 B2 | 12/2011 | Khor et al. |
| 8,072,082 B2 | 12/2011 | Yean et al. |
| 8,076,788 B2 | 12/2011 | Haba et al. |
| 8,102,039 B2 | 1/2012 | Noma et al. |
| 8,110,862 B2 | 2/2012 | Cheng et al. |
| 8,183,696 B2 | 5/2012 | Meyer et al. |
| 8,257,985 B2 | 9/2012 | Stevenson et al. |
| 8,377,829 B2 | 2/2013 | Yeh et al. |
| 8,378,480 B2 | 2/2013 | Chen et al. |
| 8,397,013 B1 | 3/2013 | Rosenband et al. |
| 8,426,961 B2 | 4/2013 | Shih et al. |
| 8,470,668 B2 | 6/2013 | Cho et al. |
| 8,518,753 B2 | 8/2013 | Wu et al. |
| 8,519,537 B2 | 8/2013 | Jeng et al. |
| 8,525,318 B1 | 9/2013 | Kim et al. |
| 8,575,493 B1 | 11/2013 | Xu et al. |
| 8,598,695 B2 | 12/2013 | Oganesian et al. |
| 8,629,546 B1 | 1/2014 | Scanlan |
| 8,674,423 B2 | 3/2014 | Collins et al. |
| 9,165,793 B1 | 10/2015 | Wang et al. |
| 9,252,127 B1 | 2/2016 | Shen et al. |
| 2004/0134796 A1 | 7/2004 | Shelp et al. |
| 2004/0174682 A1 | 9/2004 | Lin et al. |
| 2004/0178495 A1 | 9/2004 | Yean et al. |
| 2004/0183187 A1 | 9/2004 | Yamasaki et al. |
| 2004/0201111 A1 | 10/2004 | Thurgood |
| 2004/0238934 A1 | 12/2004 | Warner et al. |
| 2005/0046002 A1 | 3/2005 | Lee et al. |
| 2005/0047094 A1 | 3/2005 | Hsu et al. |
| 2005/0068739 A1 | 3/2005 | Arvelo et al. |
| 2005/0196095 A1 | 9/2005 | Karashima et al. |
| 2005/0263869 A1 | 12/2005 | Tanaka et al. |
| 2005/0266701 A1 | 12/2005 | Aoyagi |
| 2007/0029654 A1 | 2/2007 | Sunohara et al. |
| 2007/0045798 A1 | 3/2007 | Horie et al. |
| 2007/0197013 A1 | 8/2007 | Trezza |
| 2007/0221399 A1 | 9/2007 | Nishizawa et al. |
| 2007/0235850 A1 | 10/2007 | Gerber et al. |
| 2008/0128897 A1 | 6/2008 | Chao |
| 2008/0244902 A1 | 10/2008 | Blackwell et al. |
| 2008/0280394 A1 | 11/2008 | Murtuza et al. |
| 2009/0008762 A1 | 1/2009 | Jung |
| 2009/0115047 A1 | 5/2009 | Haba et al. |
| 2009/0212407 A1 | 8/2009 | Foster et al. |
| 2009/0267238 A1 | 10/2009 | Joseph et al. |
| 2010/0081236 A1 | 4/2010 | Yang et al. |
| 2010/0084761 A1 | 4/2010 | Shinagawa |
| 2010/0134991 A1 | 6/2010 | Kim et al. |
| 2010/0144101 A1 | 6/2010 | Chow et al. |
| 2010/0025081 A1 | 9/2010 | Arai et al. |
| 2010/0224980 A1 | 9/2010 | Chahal |
| 2010/0230797 A1 | 9/2010 | Honda |
| 2010/0230806 A1 | 9/2010 | Huang et al. |
| 2010/0276799 A1 | 11/2010 | Heng et al. |
| 2011/0027967 A1 | 2/2011 | Beyne et al. |
| 2011/0068468 A1 | 3/2011 | Lin et al. |
| 2011/0080713 A1 | 4/2011 | Sunohara |
| 2011/0095403 A1 | 4/2011 | Lee et al. |
| 2011/0101349 A1 | 5/2011 | Oda |
| 2011/0221072 A1 | 9/2011 | Chin |
| 2011/0287606 A1 | 11/2011 | Brun et al. |
| 2011/0300668 A1 | 12/2011 | Parvarandeh |
| 2011/0304036 A1 | 12/2011 | Son |
| 2012/0001339 A1 | 1/2012 | Malatkar |
| 2012/0020026 A1 | 1/2012 | Oganesian et al. |
| 2012/0049332 A1 | 3/2012 | Chen et al. |
| 2012/0061852 A1 | 3/2012 | Su et al. |
| 2012/0086135 A1 | 4/2012 | Thompson et al. |
| 2012/0091583 A1 | 4/2012 | Kawashita et al. |
| 2012/0101540 A1 | 4/2012 | O'Brien et al. |
| 2012/0106228 A1 | 4/2012 | Lee |
| 2012/0228778 A1 | 9/2012 | Kosenko et al. |

(56) References Cited

U.S. PATENT DOCUMENTS

| | | | |
|---|---|---|---|
| 2012/0276733 | A1 | 11/2012 | Saeki et al. |
| 2012/0295415 | A1 | 11/2012 | Ono |
| 2012/0319300 | A1 | 12/2012 | Kim |
| 2013/0010441 | A1 | 1/2013 | Oganesian et al. |
| 2013/0014978 | A1 | 1/2013 | Uzoh et al. |
| 2013/0032390 | A1 | 2/2013 | Hu et al. |
| 2013/0069239 | A1 | 3/2013 | Kim et al. |
| 2013/0082383 | A1 | 4/2013 | Aoya |
| 2013/0082399 | A1 | 4/2013 | Kim et al. |
| 2013/0087917 | A1 | 4/2013 | Jee et al. |
| 2013/0093075 | A1 | 4/2013 | Liu et al. |
| 2013/0099368 | A1 | 4/2013 | Han |
| 2013/0119527 | A1 | 5/2013 | Luo et al. |
| 2013/0119528 | A1 | 5/2013 | Groothuis et al. |
| 2013/0146991 | A1 | 6/2013 | Otremba et al. |
| 2013/0181354 | A1 | 7/2013 | Khan et al. |
| 2013/0187292 | A1 | 7/2013 | Semmelmeyer et al. |
| 2013/0208426 | A1* | 8/2013 | Kim ................ H01L 23/36 361/717 |
| 2013/0228898 | A1 | 9/2013 | Ide |
| 2013/0241026 | A1 | 9/2013 | Or-Bach et al. |
| 2013/0267046 | A1 | 10/2013 | Or-Bach et al. |
| 2013/0270660 | A1 | 10/2013 | Bryzek et al. |
| 2013/0292840 | A1 | 11/2013 | Shoemaker et al. |
| 2013/0313680 | A1 | 11/2013 | Oganesian et al. |
| 2014/0036454 | A1 | 2/2014 | Caskey et al. |
| 2014/0070380 | A1 | 3/2014 | Chiu et al. |
| 2014/0091461 | A1 | 4/2014 | Shen |
| 2014/0134803 | A1 | 5/2014 | Kelly et al. |
| 2014/0134804 | A1 | 5/2014 | Kelly et al. |
| 2014/0225244 | A1 | 8/2014 | Smith et al. |
| 2014/0246227 | A1 | 9/2014 | Lin et al. |
| 2014/0252655 | A1 | 9/2014 | Tran et al. |
| 2014/0264811 | A1 | 9/2014 | Wu |
| 2014/0319683 | A1 | 10/2014 | Lin et al. |
| 2014/0361410 | A1 | 12/2014 | Yamamichi et al. |
| 2015/0001731 | A1 | 1/2015 | Shuto |
| 2015/0021755 | A1 | 1/2015 | Hsiao et al. |
| 2015/0033786 | A1 | 2/2015 | Mansfield et al. |
| 2015/0083476 | A1* | 3/2015 | Kim ................ H05K 1/113 174/260 |
| 2015/0162270 | A1* | 6/2015 | Ashrafzadeh ........ H01L 24/97 257/666 |
| 2015/0262902 | A1 | 9/2015 | Shen et al. |
| 2015/0262928 | A1 | 9/2015 | Shen et al. |
| 2015/0262972 | A1 | 9/2015 | Katkar et al. |
| 2015/0270209 | A1* | 9/2015 | Woychik ............ H01L 21/52 257/774 |
| 2015/0364538 | A1 | 12/2015 | Wang et al. |
| 2016/0071818 | A1 | 3/2016 | Wang et al. |
| 2016/0079214 | A1 | 3/2016 | Caskey et al. |
| 2016/0093580 | A1 | 3/2016 | Scanlan et al. |
| 2016/0099210 | A1 | 4/2016 | Kwon et al. |
| 2016/0172292 | A1 | 6/2016 | Hsu et al. |
| 2018/0073999 | A1* | 3/2018 | Ahn ................ B01L 3/502707 |
| 2018/0102297 | A1* | 4/2018 | Yun .................. H01L 23/295 |

FOREIGN PATENT DOCUMENTS

| | | |
|---|---|---|
| WO | WO2005022630 A | 3/2005 |
| WO | WO2006124597 A2 | 11/2006 |
| WO | WO2007142721 A1 | 12/2007 |
| WO | WO2009070348 A1 | 6/2009 |
| WO | WO2012169162 A1 | 12/2012 |
| WO | WO2013062533 A1 | 5/2013 |

OTHER PUBLICATIONS

Written Opinion of the International Search Report dated Sep. 21, 2015 for International Application No. PCT/US2015/033786, International Filing Date Feb. 6, 2015.

ChipScale Review, "The Impact of CSPs on Encapsulation Materials," ChipScale Review publication issue Mar. 1998, retrieved Feb. 21, 2014, 6 pages.

Dr. Paul A. Magill, "A New Thermal-Management Paradigm for Power Devices," Power Electronics Technology, Nov. 2008, pp. 26-30.

Herming Chiu EH et al., "A Dynamic Thermal Management Circuit for System-On-Chip Designs," Analog Integrated Circuits and Signal Processing, 36, pp. 175-181, Jan. 25, 2003.

Hybrid Memory Cube Consortium, "Hybrid Memory Cube Specification 1.0," Last Revision Jan. 2013, 122 pages, Retrieved from: http://hybridmemorycube.org/specificationdownload/.

K. Zoschke et al., "Hermetic Wafer Level Packaging of MEMS Components Using Through Silicon Via and Wafer to Wafer Bonding Technologies" (2013 Electronic Components & Technology Conference, IEEE, pp. 1500-1507).

Lau et al., "Thin-Wafer Handling with a Heat-Spreader Wafer for 2.50/30 IC Integration," 46th International Symposium on Microelectronics (IMAPS 2013) Sep. 30-Oct. 3, 2013, Orlando, FL USA, pp. 1-8 [389-396].

Li Shang et al., "Thermal Crisis: Challenges and Potential Solutions," Potentials, vol. 25, Issue 5, Sep./Oct. 2006, pp. 31-35.

Nakamura et al., "Technology Trends and Future History of Semiconductor Packaging Substrate Material," Hitachi Chemical Review Technical Report No. 55, May 2013, pp. 24-29.

Wayne Pulliam, "Designing with BGAs," AMO presentation, 2008, 62 pages.

John H. Lau, "TSV Interposer: The most Cost-Effective Integrator for 30 IC Integration," Electronics & Optoelectronics Research Laboratories, Industrial Technology Research Institute (ITRI), retrieved on Feb. 24, 2015.

Guillian Gao—U.S. Appl. No. 62/087,361, filed Dec. 4, 2014 Semiconductor Devices With CTE-Selected Layer Within Cavities and Methods for Their Manufacture.

International Search Report and Written Opinion, dated May 12, 2015, 11 pages, PCT Patent Application No. PCT/US2015/019609.

International Search Report and Written Opinion, dated Aug. 6, 2015, 10 pages, PCT Patent Application No. PCT/US2015/028172.

Turner et al., "Mechanics of direct wafer bonding", 2006, pp. 171-188, vol. 462, doi: 10.1098/rspa.2005.1571, Proceedings of the Royal Society A, London, United Kingdom.

United States Patent and Trademark Office, First Action Interview Pilot Program Pre-Interview Communication, dated Oct. 22, 2014, for U.S. Appl. No. 14/214,365, filed Mar. 14, 2014.

Strandjord et al., "Bumping for WLCSP using Solder Ball Attach on electrolessss NiAu UBM", 2008, 29 pages, Pac Tech USA—Packaging Technologies, Inc., Santa Clara, California.

Boyle et al., "Epoxy Resins", 2001, pp. 78-89, vol. 21, ASM Handbook, Composites (ASM International).

U.S. Patent Application, "Interposers With Circuit Modules Encapsulated by Moldable Material in a Cavity, and Methods of Fabrication", filed Dec. 2, 2014, U.S. Appl. No. 14/558,462, 19 pages.

Final Office Action dated Mar. 2, 2015 of U.S. Appl. No. 14/214,365.

Notice of Allowance dated Apr. 16, 2015 of U.S. Appl. No. 14/268,899.

K.T. Turner et al., "Mechanics of direct wafer bonding", Proc. R. Soc. A, 462, 171-188, Nov. 9, 2005.

Pre-Interview First Office Action dated Oct. 22, 2014 of U.S. Appl. No. 14/214,365.

San Hwui Lee et al., "Wafer-to-Wafer Alignment for Three Dimensional Integration: A Review," Journal of Microelectromechanical Systems, vol. 20, Issue 4, Aug. 2011, pp. 885-898.

U.S. Appl. No. 14/201,585, filed Mar. 7, 2014.

U.S. Appl. No. 14/214,365 titled, "Integrated Circuits Protected by Substrates with Cavities, and Methods of Manufacture," filed Mar. 14, 2014, 40 pages.

Moody Dreiza et al., "Joint Project for Mechanical Qualification of Next Generation High Density Package-on-Package (PoP) with Through Mold Via Technology," Amkor Technology, EMPC2009—17th European Microelectronics & Packaging Conference, Jun. 16, Rimini, Italy, 8 pages.

Curtis Zwenger et al., "Next Generation Package-on_Package (PoP) Platform with Through Mold Via (TMV™) Interconnection Tech- (56) References Cited

OTHER PUBLICATIONS nology," Amkor Technology, Originally published in the proceedings of the IMPAS Device Packaging Conference, Scottsdale, AZ, Mar. 10-12, 2009, 8 pages.

Jinseong Kim et al., "Application of Through Mold Via (TMV) as PoP base package," Amkor Technology, 2008 IEEE Reprinted from ECTC2008 Proceedings, 6 pages.

U.S. Appl. No. 14/250,317 titled "Die Stacks With One or More Bond Via Arrays," filed Apr. 10, 2014, 58 pages.

Rabindra N. Das et al., "Package-Interpose-Package (PIP) Technology for High End Electronics," Endicott Interconnect Technologies, Inc., retrieved Jul. 31, 2014, 4 pages.

Heather McCormick et al., "Assembly and Reliability Assessment of Fine Pitch TMV Package on Package (PoP) Components," Amkor Technology Inc., Originally published in the Proceedings of the SMTA International Conference, San Diego, CA, Oct. 4-8, 2009, 8 pages.

U.S. Appl. No. 14/288,064 titled, "Integrated Circuit Assemblies With Reinforcement Frames, and Methods of Manufacture," filed May 27, 2014.

U.S. Appl. No. 14/328,380 titled, "Microelectronic Assemblies With Integrated Circuits and Interposers With Cavities, and Methods of Manufacture," filed Jul. 10, 2014.

U.S. Appl. No. 14/268,899 titled, "Making Electrical Components in Handle Wafers of Integrated Circuit Packages," filed May 2, 2014.

Office Action dated Jul. 9, 2015 for U.S. Appl. No. 14/558,462, 11 pages.

International Search Report and Written Opinion for PCT/US2015/032572 dated Nov. 23, 2015.

\* cited by examiner

INTEGRATED INTERPOSER SOLUTIONS FOR 2D AND 3D IC PACKAGING

RELATED APPLICATIONS

This application is a division of U.S. patent application Ser. No. 14/586,580, filed on Dec. 30, 2014, the entire disclosure of which is incorporated herein by reference, and which claims the benefit of U.S. Provisional Application No. 62/007,758, filed Jun. 4, 2014, the entire disclosure of which is incorporated herein by reference.

BACKGROUND

Technical Field

This application relates to integrated circuit (IC) packages and wafer scale methods for making them in general, and in particular, to making two-dimensional (2D) and three-dimensional (3D) IC packages using integrated interposers (ITPs).

Related Art

In recent years, the size of semiconductor chips has shrunk dramatically in order to achieve a number of performance goals, e.g., higher signal propagation, lower power consumption, lower fabrication costs, and reduced form factors, among others. As the semiconductor industry has struggled to pack more functionality into smaller and smaller spaces, some have suggested that, without new ground-breaking technologies in processing and assembly, the well-known "Moore's law," i.e., that the number of transistors in densely integrated circuits doubles approximately every two years over the history of computing hardware, may cease to hold true. Vertical integration, i.e., three-dimensional integrated circuit ("3D IC" or "3D") packaging, has emerged as one of the more promising technology to achieve the above goals.

However, 3D IC packaging presents designers and fabricators with a number of challenges. For example, a current trend in 3D IC assembly is to assemble microbumped dies onto thin interposers (ITPs). However, fabrication and assembly of relatively thin ITPs can create a number of problems. One is that, in order to thin the ITP down to the desired thickness, the ITP wafer is typically mounted on a "carrier" with temporary adhesives, typically low-melting-temperature polymers, during the thinning and subsequent processing. The relatively low melting temperatures of the adhesives limit the overall maximum temperatures that can be used in so-called "backside" processing. Wafer breakage is also increased during the demounting process and associated wafer handling. Another problem is a warpage issue that can occur during assembly in that, not only it is it very difficult to connect microbumps to a warped ITP die, but the warpage also creates a long term reliability issue by imposing stresses on solder bumps and functional dies.

Accordingly, a long felt but as yet unsatisfied need exists for 2D and 3D IC designs and manufacturing methods that overcome the foregoing and other problems of the prior art.

SUMMARY

In accordance with embodiments of the present disclosure, novel 2D and 3D IC packages using integrated ITPs are provided, together with methods for making them.

In one example embodiment, a 2D IC package comprises a first substrate having a backside surface and a top surface with a cavity disposed therein. The cavity has a floor defining a front side surface. A plurality of first electroconductive contacts are disposed on the front side surface, and a plurality of second electroconductive contacts are disposed on the back side surface. A plurality of first electroconductive elements penetrate through the first substrate and couple selected ones of the first and second electroconductive contacts to each other. A first die containing an IC is electroconductively coupled to corresponding ones of the first electroconductive contacts. A second substrate has a bottom surface that is sealingly attached to the top surface of the first substrate, and a dielectric material is disposed in the cavity so as to encapsulate the first die. The dielectric material can comprise an inorganic material.

In another example embodiment, the foregoing 2D IC package can be used as a foundation for making a 3D IC package comprising a plurality of third electroconductive contacts disposed on a top surface of the first die, a plurality of fourth electroconductive contacts disposed on a top surface of the second substrate, and a plurality of second electroconductive elements penetrating through the second substrate and coupling selected ones of the third and fourth electroconductive contacts to each other. A second die containing an IC is electroconductively coupled to corresponding ones of the fourth electroconductive contacts, and a cover having a bottom surface is sealingly attached to the top surface of the second substrate so as to enclose the second die.

The scope of this invention is defined by the claims appended hereafter, which are incorporated into this section by reference. A more complete understanding of the features and advantages of the novel methods for fabricating novel 2D and 3D IC packages using integrated ITPs will be afforded to those of some skill in the art by a consideration of the detailed description of some example embodiments thereof presented below, especially if such consideration is made in conjunction with the figures of the appended drawings briefly described below, wherein like reference numerals are used to identify like elements illustrated in one or more of the figures thereof.

BRIEF DESCRIPTION OF THE SEVERAL FIGURES OF THE DRAWINGS

FIGS. 1-30 are partial cross-sectional views of portions of one or more wafers, illustrating sequential steps involved in example embodiments of wafer scale methods for manufacturing example embodiments of 2D and 3D IC packages in accordance with the present invention, wherein:

DETAILED DESCRIPTION

In accordance with the present disclosure, example embodiments of 2D and 3D integrated circuit packages are provided, together with methods for making them using integrated ITPs.

"Wafer level" or "wafer scale" production of integrated circuit (IC) packages has proliferated in recent years, due primarily to the economies of scale that such production techniques afford, together with a concomitant reduction in size and cost of the resulting packages. Examples of such IC packages and methods for making them can be found in, e.g., commonly owned U.S. patent application Ser. No. 14/214,365 by H. Shen, et al., filed Mar. 14, 2014, and entitled "Integrated Circuits Protected by Substrates with Cavities, and Methods of Manufacture," the entire disclosure of which is incorporated herein by reference.

In only one of many possible embodiments, such packages can be cut, or "singulated" from a wafer or a sandwich of two or more aligned wafers containing a number of similar packages, and can include a portion of at least one wiring substrate wafer, sometimes referred to as an "interposer" (ITP) wafer, having an upper surface upon which are mounted one or more semiconductor dies, chips or stacked dies (which can be packaged or unpackaged), each containing one or more integrated circuits (ICs). The ITP can contain a pattern of electroconductive traces, e.g., in the form of a "redistribution layer" (RDL), on its upper surface, its lower surface, and/or intermediate its upper and lower surfaces, to which the ICs are variously electroconductively connected to each other and/or other components. The ITP can also mount and/or contain discrete passive electrical components, such as resistors, capacitors, inductors, or the like, that are disposed either on its surface or within its thickness, as described in, e.g., commonly owned U.S. patent application Ser. No. 14/268,899 by L. Wang, et al., filed May 2, 2014, and Ser. No. 14/304,535 by L. Wang, et al., filed Jun. 13, 2014, the entire disclosure of each of which is incorporated herein by reference.

Silicon ITPs, using through-silicon "vias" (TSVs) can become a key component of the 3D IC technology evolution, in which dies are stacked and electroconductively connected vertically to function as a single device. A typical TSV fabrication process can involve a deep reactive ion etching of a through-hole, or "via" in a silicon wafer, chemical vapor deposition (CVD) or physical vapor deposition (PVD) of barrier and seed layers inside the via, and electrochemical deposition (ECD) of e.g., copper (Cu), tungsten (W) or polycrystalline silicon (polysilicon) to fill the via with an electroconductive material.

To increase the speed of packaged devices, signal transmission lines must be made very short. The current trend in 3D IC assembly is to assemble microbumped dies onto thin ITPs, e.g., in the range of 25-100 microns or micrometers ($\mu m$) (1 $\mu m=1\times 10^6$ meters) in thickness. However, fabrication and assembly of such thin ITPs can create several problems. One is that, in order to thin the ITP down to the desired thickness, the ITP wafer is typically mounted on a carrier with a temporary adhesive, typically low-melting-temperature polymers, during the thinning and subsequent processing. The low melting temperatures of the adhesives disadvantageously limit the overall temperatures that can be used in backside processing. The likelihood of wafer breakage is also increased during the demounting process and subsequent wafer handling. Another problem that can occur with thin ITPs is a warpage issue during assembly in that, not only is it very difficult to connect microbumps on a warped ITP die, the warpage also creates long term reliability issues by imposing stresses on solder bumps and functional dies during use.

Through research and development, it has been discovered that the thin-wafer handling and warpage issues above can be successfully resolved by the utilization of a carrier wafer in which, unlike the temporary carrier used in the conventional process, the carrier wafer (or an associated portion of it) becomes an integral part of the mechanical structure of the end IC packages. Thus, functional dies are attached to a full-thickness ITP wafer. Using wafer-to-wafer bonding, the carrier wafer, or an associated portion of it, is permanently attached to the ITP to fully enclose the functional dies. The carrier wafer provides the necessary support and structure during the subsequent thinning processes of the ITP wafer, without the need to mount the wafer to a carrier wafer using a low-melting-temperature adhesive. The carrier wafer and the ITP wafer are thermally matched such that, after processing, there is little or no stress resulting from a mismatch in the respective coefficients of thermal expansion (CTEs) of the carrier and ITP wafers, in contrast to conventional die attach and molding processes.

In accordance with the foregoing, FIGS. 1-19A are partial cross-sectional views of portions of one or more wafers, illustrating sequential steps involved in a first example embodiment of a wafer level method for manufacturing 2D, 2.5D and/or 3D IC packages in accordance with the present disclosure, together with example embodiments of the IC packages produced thereby after they are singulated from the wafer sandwich.

Figure 1:
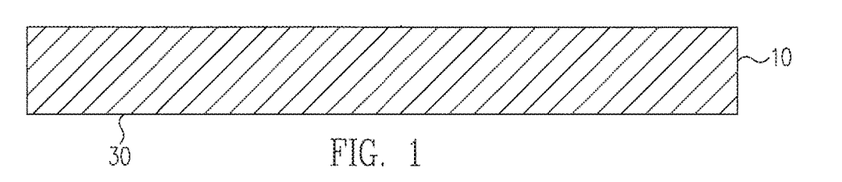
FIG. 1 is a cross-sectional view of a portion of a wafer defining a first substrate.

FIG. 1 is a cross-sectional view of a portion of a full-thickness wafer defining a first substrate 10. Although in FIG. 1 and the subsequent figures, only a portion of the wafer, e.g., the portion defining the first substrate 10 associated with a single end IC package, i.e., after singulation, is shown and described in connection with the processes applied to it, it should be understood that, in wafer level manufacturing, those processes are also being applied to other, adjacent portions of a whole wafer, either simultaneously or sequentially, prior to the singulation of the individual packages from the wafer sandwich.

The wafer can comprise a wide variety of suitable materials, including semiconductor materials, e.g., monocrystalline silicon, which is amenable to well-known photolithography manufacturing techniques and has a CTE matched to that of, e.g., one or more silicon IC dies that are attached to it. Alternatively or additionally, other materials, such as glass, metal, or other suitable material, can be utilized or incorporated.

Figure 2:
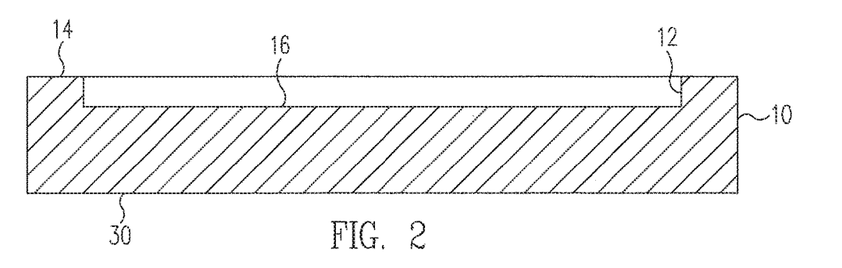
FIG. 2 is a cross-sectional view of the substrate of FIG. 1, showing a cavity disposed in an upper surface thereof.

As illustrated in FIG. 2, a first step in the first example method for making a 2D or 3D IC package can comprise forming a cavity 12 in a top surface 14 of the substrate 10. The cavity 12 cavity has a floor defining a front side surface 16. In only one of many possible embodiments, the cavity 12 can have a depth of, e.g., between 50-500 $\mu m$, and can be formed using one or more known etching techniques, e.g., reactive ion etching (ME).

Figure 3:
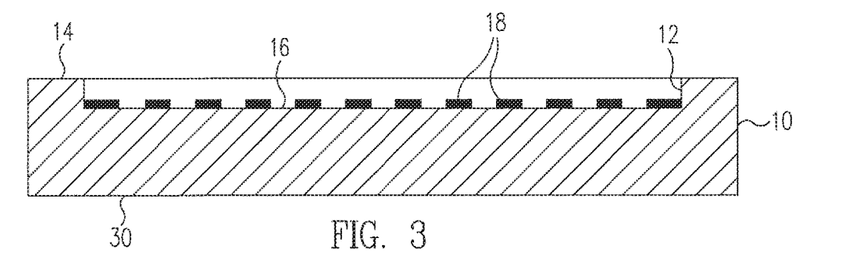
FIG. 3 is a cross-sectional view of the substrate of FIG. 2, showing a plurality of electroconductive contacts disposed on a floor of the cavity.

FIG. 3 is a cross-sectional view of the substrate of FIG. 2, showing a next step in the first method, the formation of a plurality of electroconductive contacts 18 disposed on the front side surface 16 of the substrate 10. This can be effected by, e.g., depositing and patterning a thin layer of an insulator, e.g., silicon dioxide ($SiO_2$), on the front side surface 16, then depositing and patterning a metal, e.g., copper (Cu) on the insulator layer using, for example, a Cu evaporation technique, or an electroless nickel (Ni) immersion gold (Au) (ENIG) plating technique.

Figure 4:
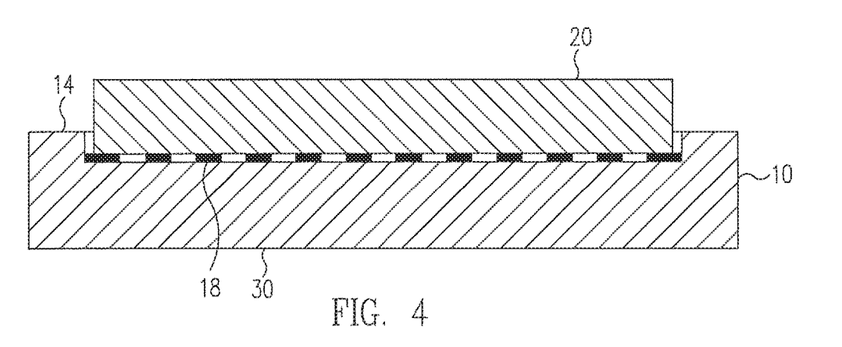
FIG. 4 is a cross-sectional view of the substrate of FIG. 3, showing a first die containing an IC electroconductively coupled to corresponding ones of the electroconductive contacts.

As illustrated in FIG. 4, after the electroconductive contacts 18 have been defined on the top side surface 16, a first die 20 containing at least one IC is disposed within the cavity 12 and electroconductively coupled to corresponding ones of the contacts 18. For example, in one embodiment, electroconductive contacts (not illustrated) disposed on a bottom face of the die 20 can be coupled to opposing ones of the contacts 18 using a reflow soldering technique in which solder bumps disposed between opposing contacts on the substrate 10 and the die 20 are first melted, e.g., in an oven, to wet both of the opposing contacts with the solder, then allowed to solidify into an electroconductive joint.

Figure 5:
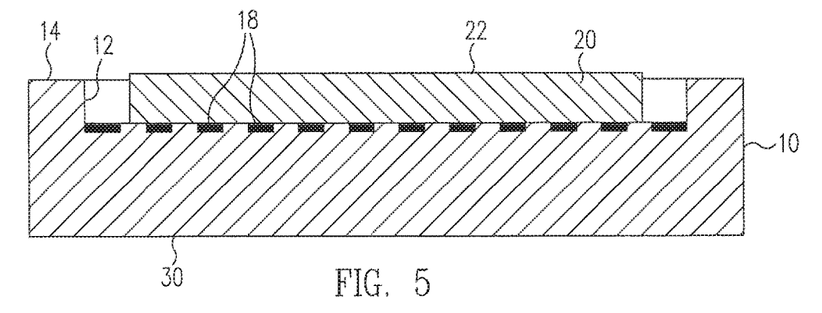
FIG. 5 is a cross-sectional view of the substrate and die of FIG. 4, shown after a thinning process has been applied to top surfaces of the substrate and the die for reducing IC package thickness.
Figure 6:
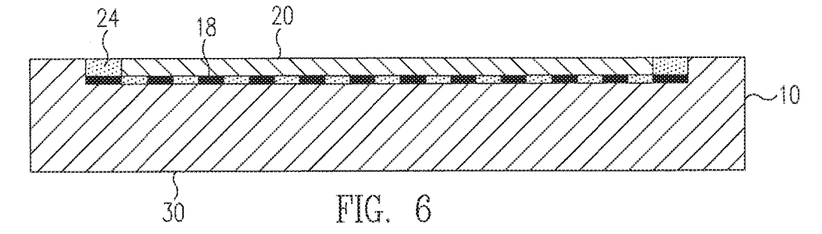
FIG. 6 is a cross-sectional view of the substrate and die of FIG. 5, shown after a planarization process for making top surfaces of the substrate, the die and a dielectric material disposed within the cavity coplanar with each other, and for reducing IC package thickness.

As illustrated in FIG. 5, after the die 20 is coupled to the substrate 10, a thinning process, e.g., a further etching process, chemical and/or mechanical polishing, etc., can be carried out simultaneously on the top surfaces 14 and 22 of the substrate 10 and the die 20 to reduce the thickness of the end IC package. As illustrated in FIG. 6, after the substrate 10 and die 20 have been thinned down to the desired thickness, the cavity 12 can be filled with, e.g., a dielectric bonding material 24, e.g., an epoxy resin, to embed the die 20 within the cavity 12, i.e., to underfill, rigidize and couple it closely with the inner surfaces of the cavity 12. Additionally or alternatively, at least a portion of the cavity can be filled with a thermally conductive material or an inorganic layer, such as an oxide or nitride, as discussed in commonly owned Prov. App. No. 62/087,361, filed Dec. 4, 2014, the entire disclosure of which is incorporated herein by reference. Such materials can offer improved thermal characteristics, CTE matching, or both.

Figure 7:
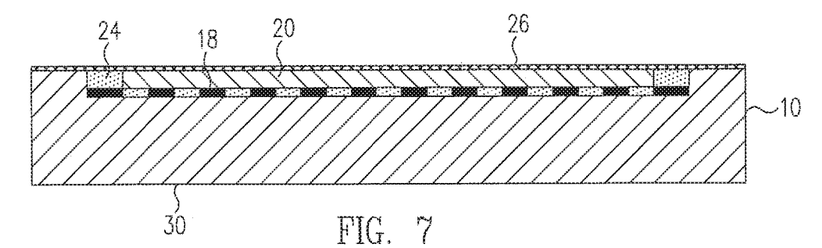
FIG. 7 is a cross-sectional view of the substrate, die and dielectric material of FIG. 6, showing a layer of a bonding material deposited onto the planarized top surfaces thereof.

As illustrated in FIG. 6, the respective upper surfaces of the substrate 10, the die 20 and the bonding material 24 can then be planarized using, e.g., a chemical mechanical polishing (CMP) technique, such that the top surfaces of the substrate 10, the die 20 and the bonding material 24 disposed within the cavity 12 are made coplanar with each other. Following this step, a layer 26 of a bonding material can be deposited onto the planarized top surface, as illustrated in FIG. 7. Depending on the particular application at hand, the bonding material can comprise, for example, an oxide, e.g., $SiO_2$, a nitride, a metal, Benzocyclobutene (BCB), a thermal interface material (TIM), an adhesive, glass frit, or the like.

Figure 8:
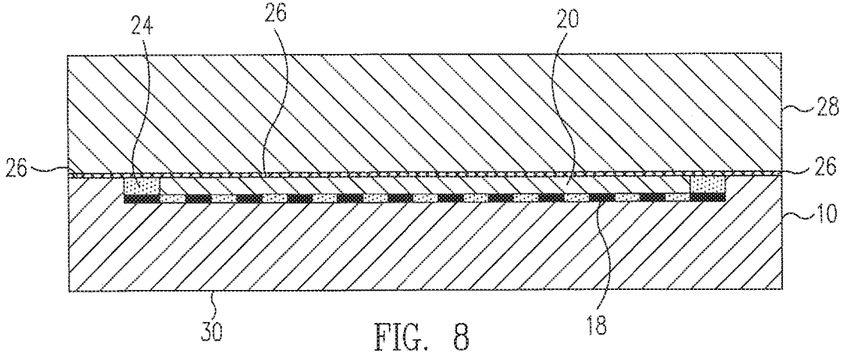
FIG. 8 is a cross-sectional view of the substrate, die and bonding material of FIG. 7, showing a second substrate having a bottom surface sealingly attached to at least the top surface of the first substrate.

As illustrated in FIG. 8, a bottom surface of a second substrate 28, e.g., comprising a portion of a second or "cover" wafer comprising, e.g., silicon, is then sealingly attached, i.e., bonded, to the planarized top surfaces of at least the first substrate 10, and in some embodiments, the die 20 and the bonding material 24 using the layer 26 of bonding material. As above, depending on the application at hand, the bond effected can comprise, for example, a surface bond, e.g., an anodic or a fusion bond, a metallic interlayer bond, e.g., a eutectic, thermocompression or solder bond, or an insulating interlayer bond, e.g., a glass frit or an adhesive bond. Moreover, the second substrate 28 wafer can comprise a glass panel or other suitable material.

As those of some skill will appreciate, the second substrate 28 need not necessarily comprise a portion of a second wafer. Thus, in an alternative embodiment, the layer 26 of bonding material can be omitted, and the second substrate 28 can instead comprise a layer of a polymer, e.g., an epoxy resin, that is molded over the planarized top surfaces of the first substrate 10, die 20 and bonding material 24, or in yet other embodiments, could comprise a TIM layer or a metal layer.

Figure 9:
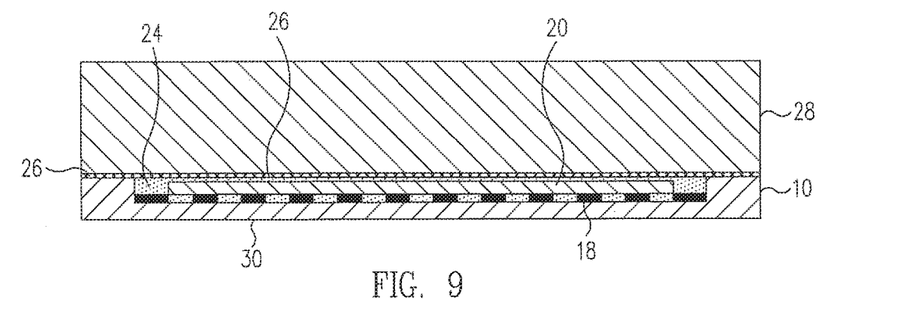
FIG. 9 is a cross-sectional view of the substrates and die of FIG. 8, shown after the application of a thinning process to a back side surface of the first substrate for reducing IC package thickness.
Figure 10:
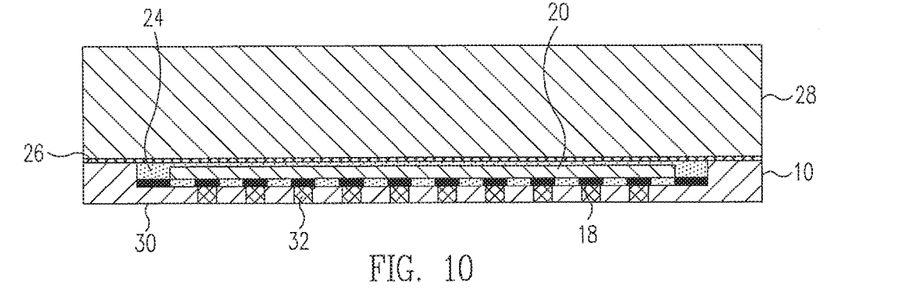
FIG. 10 is a cross-sectional view of the substrates and die of FIG. 9, showing a plurality of electroconductive elements penetrating through the first substrate and having upper ends coupled to selected ones of the electroconductive contacts on the floor of the cavity.

As illustrated in FIG. 9, a thinning process, e.g., a CMP process, can then be applied to a back side surface 30 of the first substrate 10 for a further reduction in end IC package thickness. As those of some skill may note, this can be effected in part by clamping a top surface of the second substrate 28 to a conventional vacuum or electrostatic wafer chuck. After the back side thinning process, a plurality of first electroconductive elements 32 can be formed in the back side surface 30. As illustrated in FIG. 10, the first electroconductive elements 32 can comprise, for example, via-last-process TSVs that penetrate through the first substrate 10 and have upper ends coupled to selected ones of the electroconductive contacts 18 that are disposed on the front side surface 16 of the first substrate 10. Alternatively, it should be noted that a via-first or via-middle process could be employed, in which partial TSVs are provided before attaching the die 20 and can be revealed by the thinning process discussed above in connection with FIG. 9.

Figure 11:
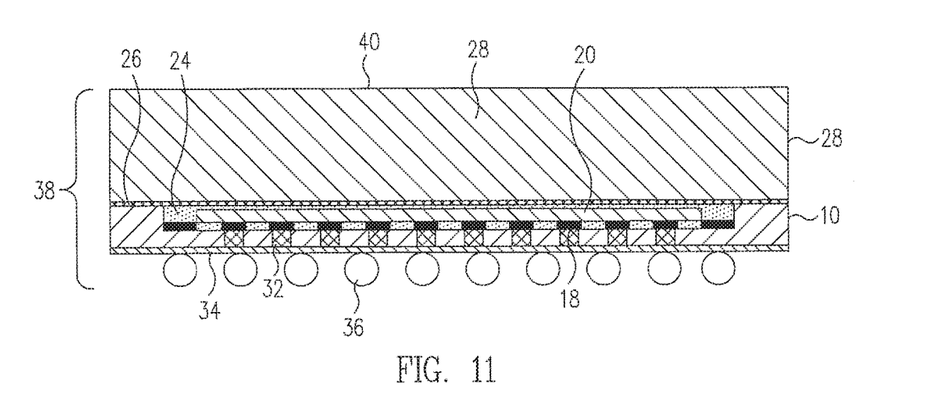
FIG. 11 is a cross-sectional view of the substrates and die of FIG. 10, showing an electroconductive redistribution layer (RDL) disposed on the back side surface of the first substrate and a plurality of electroconductive solder bumps respectively coupled to lower ends of selected ones of the electroconductive elements by the RDL.

If no other thinning processes are to be applied, then as illustrated in FIG. 11, the method can continue with the formation of under-bump metallizations (UBMs) on the back side surface 30 of the first substrate 10, which can include the formation of a patterned electroconductive redistribution layer (RDL) 34 thereon, followed by the formation of a plurality of electroconductive solder bumps 36 respectively coupled to corresponding ones of the UMBs and/or the RDL 34. The UMBs and/or the RDL 34 selectively interconnect lower ends of the electroconductive elements 18, the UMBs and/or the RDL 34 to each other like the conductive traces of a conventional printed circuit board (PCB), and can be effected by, e.g., depositing and patterning a thin layer of an insulator, e.g., silicon dioxide ($SiO_2$), on the back side surface 30 of the first substrate 10 (if that step has not already been implemented during the formation of the electroconductive interconnects 32), then depositing and patterning a metal, e.g., Cu on the surface using, e.g., Cu evaporation, or ENIG plating. FIG. 11 illustrates an example embodiment of a 2D IC package 38 resulting after its singulation from the wafer sandwich.

However, if it is desired to thin the end IC package 38 further, one or more of the foregoing "back side" processes and corresponding features can be delayed in favor of a top side thinning operation similar to that applied to back side surface 30 of the first substrate 10 described above in connection with FIG. 9, except applied to a top surface 40 of the second substrate 28, during which the back side surface 30 of the first substrate 10, sans the delayed features, can be clamped to a conventional wafer chuck. The substantially thinner 2D IC package 38 resulting after the delayed features above are added to it and it has been singulated from the wafer sandwich is illustrated in the cross-sectional view of FIG. 12.

Figure 13:
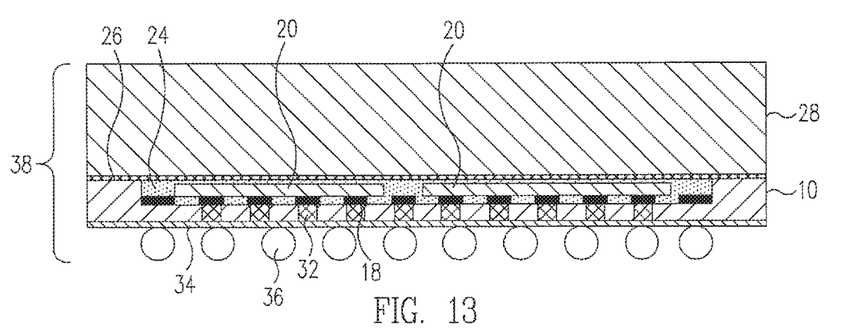
FIG. 13 is a cross-sectional view similar to FIG. 11, except showing a plurality of first dies electroconductively coupled to corresponding ones of the electroconductive contacts on the floor of the cavity.

As illustrated in FIG. 13, in some embodiments, the first die 20 can advantageously comprise a plurality of first dies 20 that are electroconductively coupled to corresponding ones of the electroconductive contacts 18 disposed on the top side surface 16 of the first substrate 10, rather than a single die 20. Further, while only single dies 20 are shown in the example embodiments illustrated, it should be understood that the single dies 20 shown may represent stacks of vertically interconnected dies, i.e., "die stacks."

Figure 14:
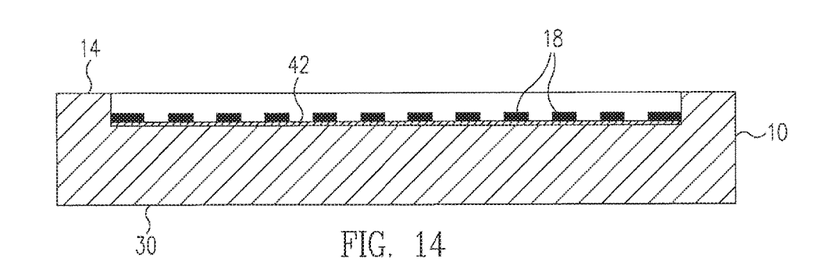
FIG. 14 is a cross-sectional view similar to FIG. 3, except showing an electroconductive redistribution layer (RDL) disposed on the floor of the cavity and coupling selected ones of the electroconductive contacts disposed thereon to each other.

FIG. 14 is a cross-sectional view similar to FIG. 3, except showing that an RDL 42 can also be formed on the front side surface 18 of the first substrate 10 and used to couple selected ones of the electroconductive contacts 18 disposed thereon to each other. This RDL 42 can be formed immediately after the electroconductive contacts 18 are formed, alternatively or in addition to the RDL 34 on the back side surface 30 of the first substrate 10 described above, and by using the same materials and processes used to form the RDL 34. As discussed above, if implementing a via-first or a via-middle process, the TSVs can be partially formed in the first substrate 10 prior to the formation of the RDL 42.

Figure 12:
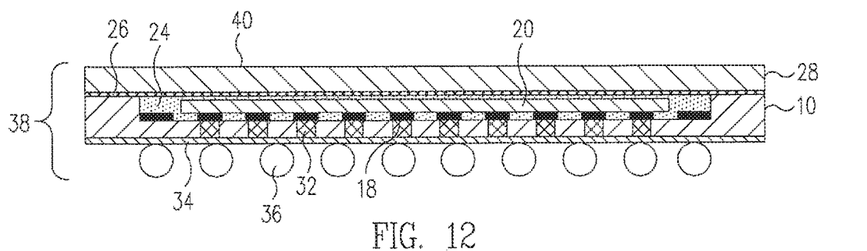
FIG. 12 is a cross-sectional view of the substrates and die of FIG. 11, shown after the application of a thinning process to a top surface of the second substrate for reducing IC package thickness.
Figure 15:
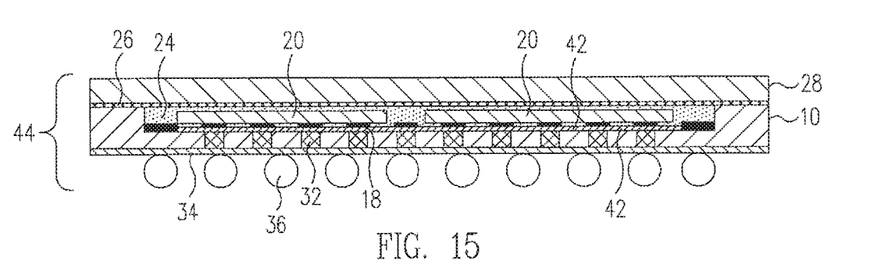
FIG. 15 is a cross-sectional view similar to FIG. 12, except showing the RDL of FIG. 14 disposed therein.

FIG. 15 is a cross-sectional view of an example embodiment of a so-called "2.5D" IC package 44 similar to that illustrated in FIG. 12, except that it incorporates a plurality of first dies 20, as discussed above in connection with FIG. 13, and a second RDL 42, as discussed above in connection with FIG. 14.

Figure 16:
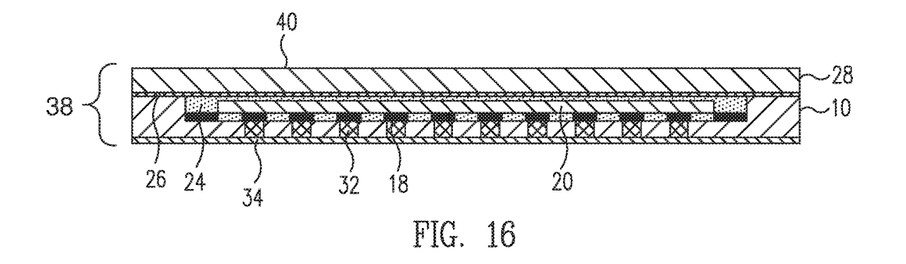
FIG. 16 is a cross-sectional view similar to FIG. 12, except without solder bumps.
Figure 17:
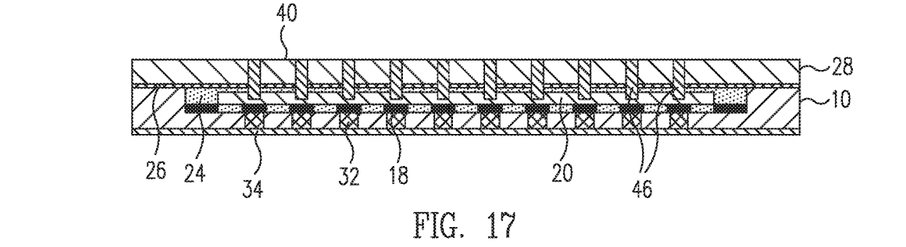
FIG. 17 is a cross-sectional view of the substrate of FIG. 16, showing a plurality of second electroconductive elements penetrating through the second substrate and having lower ends respectively coupled to selected ones of a plurality of electroconductive contacts disposed on an upper surface of the first die.

FIG. 16 is a cross-sectional view of an IC package 38 similar to that of FIG. 12, but shown prior to the formation of the solder bumps 36 on the back side surface thereof. As discussed below in connection with FIGS. 17-19A, this nascent 2D package 38 can be used as the foundation for making a 3D IC package 56. Thus, as illustrated in FIG. 17, the first example method can continue from the stage illustrated in FIG. 16 with the formation a plurality of second electroconductive elements 46, e.g., TSVs, that penetrate through the second substrate 28 and have lower ends respectively coupled to selected ones of a plurality of electroconductive contacts disposed on an upper surface of the first die 20, in a manner similar to that of the first electroconductive elements 32 discussed above in connection with FIG. 10.

Figure 18:
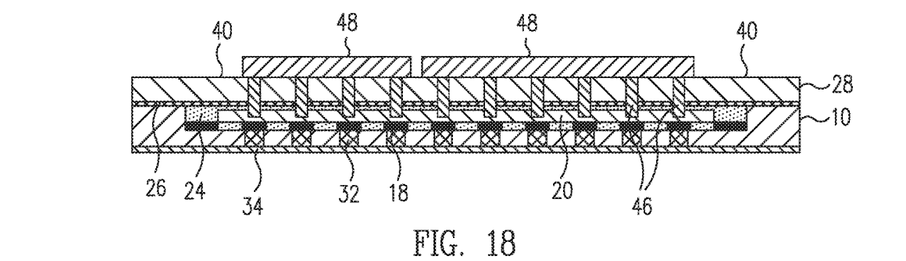
FIG. 18 is a cross-sectional view of the substrates and die of FIG. 17, showing a plurality of second IC dies, each electroconductively coupled to upper ends of corresponding ones of the second electroconductive elements.

As illustrated in FIG. 18, one or more second dies 48 (or die stacks), each having electroconductive contacts (not illustrated) disposed on a respective lower face thereof, can be coupled to opposing upper ends of corresponding ones of the second electroconductive elements 46 using a soldering technique similar to that used to connect the first die(s) 20 discussed above in connection with FIG. 4.

Figure 19A:
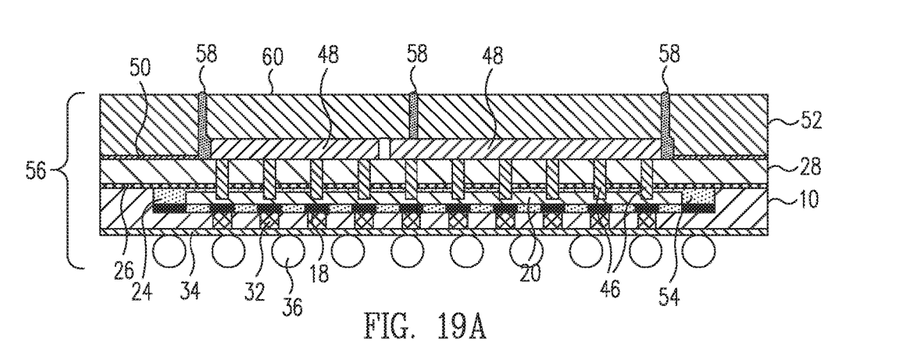
FIG. 19A is a cross-sectional view of the substrates and die of FIG. 18, showing a third substrate having a bottom surface with a cavity disposed therein, in which the bottom surface is sealingly attached to the top surface of the second substrate such that the second die is disposed within the cavity and a dielectric material disposed within the cavity encapsulates the second die.

Following this step, a layer 50 of a bonding material, e.g., a layer of an oxide, e.g., $SiO_2$, a metal, BCB, TIM, an adhesive, glass frit, or the like, can be deposited onto the top surface 40 of the second substrate 28, in a manner similar to that discussed above in connection with FIG. 7. As illustrated in FIG. 19A, a third substrate 52, e.g., comprising a portion of a third wafer made of, e.g., silicon, is provided. The third substrate 52 can have a bottom surface with a cavity 54 disposed therein. The bottom surface of the third substrate 52 can then be bonded to the top surface 40 of the second substrate 28 such that the second dies 48 are disposed within the cavity 54. As discussed above in connection with FIG. 8 and the bonding of the second substrate 28 to the first substrate 10, the bond can be effected using a wide variety of wafer bonding techniques.

In the particular example 3D IC package 56 illustrated in FIG. 19A, the second dies 48 are advantageously encapsulated with a filler, such as an epoxy or a TIM disposed within the cavity 54, to reinforce the mounting of the second dies 48 within the IC package 56 and/or to provide an enhanced heat transfer path between the dies 48 to the ambient surrounding the package 10.

As illustrated in FIG. 19A, in one possible embodiment, this can be effected by forming one or more channels 58 in the third substrate 52 that extend between the cavity 54 and a top surface 60 of the third substrate 52. Depending on whether the filler is introduced before or after the third substrate 52 is attached, the filler can be injected into and/or escape out of, the cavity 54 through the channels 58, thereby limiting voids and enabling outgassing, etc. As discussed above, an oxide layer or other inorganic material can be formed on the dies 20 prior to the addition of the filler to at least partially fill the cavity in the third substrate 52. This decreases the amount of filler required, which can lower the effective CTE of the filled cavity.

As discussed above in connection with FIG. 8 and the second substrate 28, the third substrate 52 need not necessarily comprise a portion of a wafer. Thus, in an alternative embodiment, the layer 50 of bonding material can be omitted, and the third substrate 52 can instead comprise a layer of a polymer, e.g., an epoxy resin, that is molded over the top surfaces of the second substrate 28 and the second dies 48.

Figure 19B:
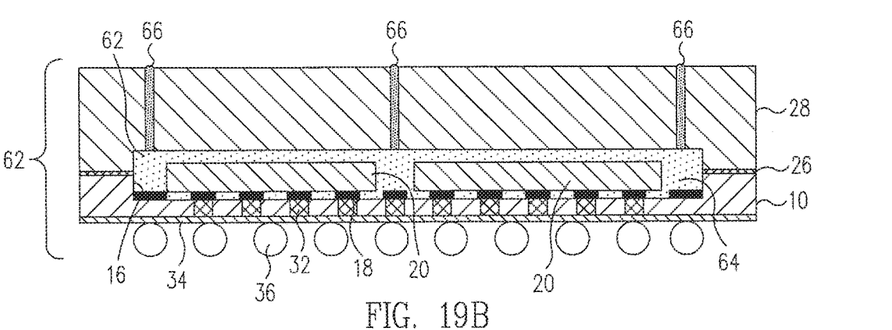
FIG. 19B is a cross-sectional view similar to FIG. 13, except that the second substrate has a bottom surface with a cavity disposed therein, in which the bottom surface is sealingly attached to the top surface of the first substrate such that the respective cavities of the substrates combine to form a larger cavity, a plurality of first dies are disposed within the larger cavity and a dielectric material disposed within the larger cavity encapsulates the first dies.

FIG. 19B is a cross-sectional view of a 2D IC package 62 similar to the 2D package 38 of FIG. 13, in that it includes first and second bonded substrates 10 and 28 and a plurality of first dies 20. However, as illustrated in FIG. 19B, the IC package 62 differs from the IC package 38 in that the second substrate 20, like the first substrate 10, also has a cavity 62 disposed in a bottom surface thereof. The bottom surface of the second substrate 28 is bonded to the top surface of the first substrate 10 such that the respective cavities 16 and 62 of the two substrates 10 and 28 combine to form a single larger cavity 64, with the first dies 20 disposed therein. And, as discussed above in connection with the embodiment of FIG. 19B, the first dies 20 can be advantageously encapsulated with a filler, such as an epoxy or a thermal interface material, by injecting the material through channels 66 formed within the second substrate 28 and into the enlarged cavity 64. As also discussed above, the cavity can also be at least partially filled with an inorganic material, such as an oxide layer. Thus, the IC package 62 of FIG. 18B produced by the first example method described above can provide a multi-cavity solution for thicker dies or die stacks, or for System On Chip (SOC) devices.

FIGS. 20-30 are partial cross-sectional views of portions of one or more wafers, illustrating sequential steps involved in a second example embodiment of a wafer level method for manufacturing 2D, 2.5 D, and/or 3D IC packages in accordance with the present invention, together with example embodiments of the packages produced thereby.

Figure 20:
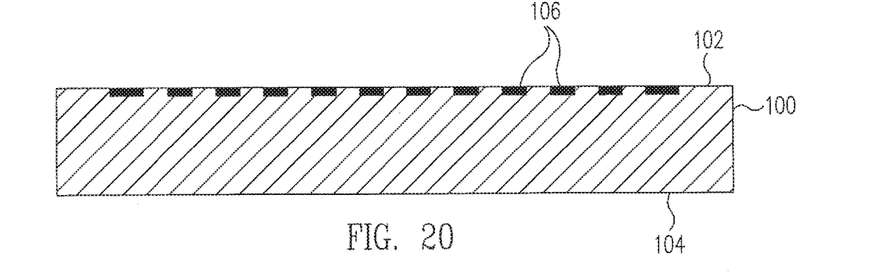
FIG. 20 is a cross-sectional view of a portion of a wafer defining an alternative embodiment of a first substrate in accordance with the present invention, showing a plurality of electroconductive contacts disposed on a front side surface thereof.

FIG. 20 is a cross-sectional view of a portion of a full-thickness wafer defining a first substrate 100 having front side surface 102 with a plurality of electroconductive contacts 106 formed thereon, and a back side surface 104. The first substrate 100 illustrated in FIG. 20 is thus similar to the first substrate 10 discussed above in connection with FIG. 3, except that in this example embodiment, the substrate 100 lacks a cavity in its top surface. Except for this difference, the substrate 100 can be made using the same materials and processing steps as described above in connection with FIGS. 1-3 and the substrate 10.

Figure 21:
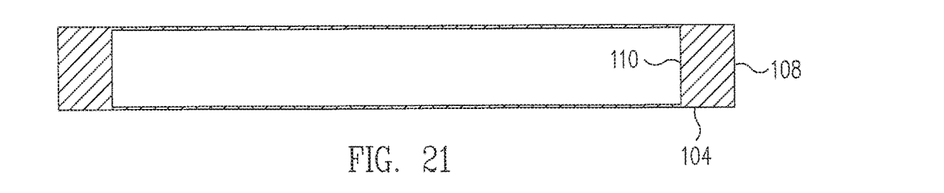
FIG. 21 is a cross-sectional view of a portion of a wafer defining an alternative embodiment of a second substrate having an opening extending through it.
Figure 22:
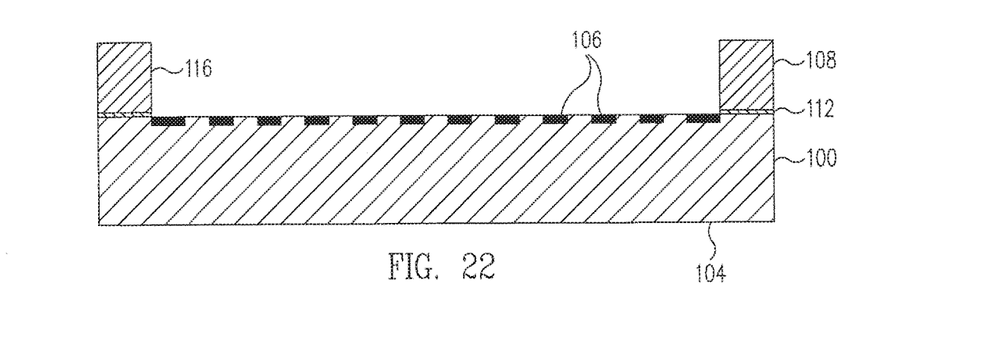
FIG. 22 is a cross-sectional view of the first and second substrates of FIGS. 20 and 21, shown after a bottom surface of the second substrate has been bonded to a top surface of the first substrate to define a cavity.

FIG. 21 is a cross-sectional view of a portion of a wafer defining an alternative embodiment of a second substrate 108 having an opening 110 extending through it in the manner of a window frame. As illustrated in FIG. 22, a layer 112 of a bonding material can be disposed on a marginal area of the front side surface 102 of the first substrate 100 surrounding the electroconductive contacts 106, and a bottom surface 114 of the second substrate 108 can be bonded to the front side surface 102 of the first substrate 100 to define a first cavity 116 using methods similar to those discussed above in connection with FIGS. 8, 19A and 19B.

Figure 23:
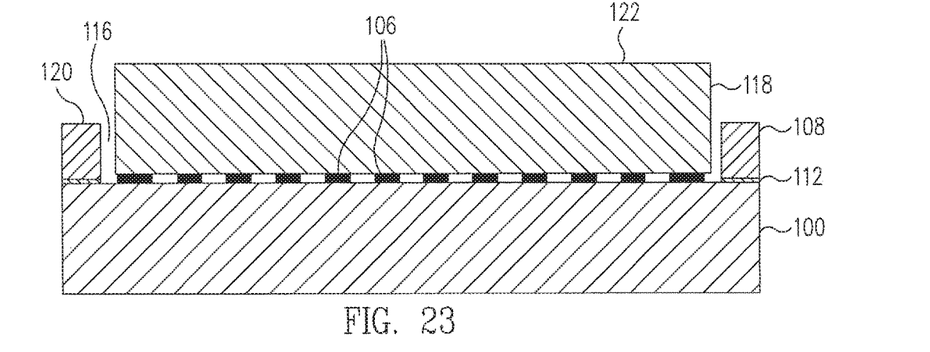
FIG. 23 is a cross-sectional view of the substrates of FIG. 22, showing a first die containing an IC disposed within the cavity and electroconductively coupled to corresponding ones of the electroconductive contacts on the front side surface of the first substrate.

As those of some skill will recognize, the embodiment of FIG. 22 is substantially similar to that of the embodiment discussed above in connection with FIG. 3 and the first embodiment, and subsequent processing can follow a path substantially similar to that discussed above in connection with the first embodiment. Thus, as illustrated in FIG. 23, a first die 118 containing an IC can be disposed within the first cavity 116 and electroconductively coupled to corresponding ones of the contacts 106 disposed on the top side surface 102 of the first substrate 100 using, for example, reflowed solder bumps.

Figure 24:
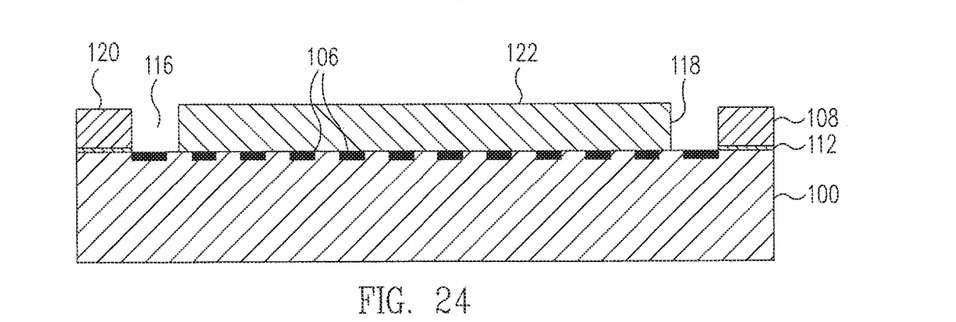
FIG. 24 is a cross-sectional view of the substrates and die of FIG. 23, shown after a thinning process has been applied to top surfaces of the second substrate and the die for reducing IC package thickness.
Figure 25:
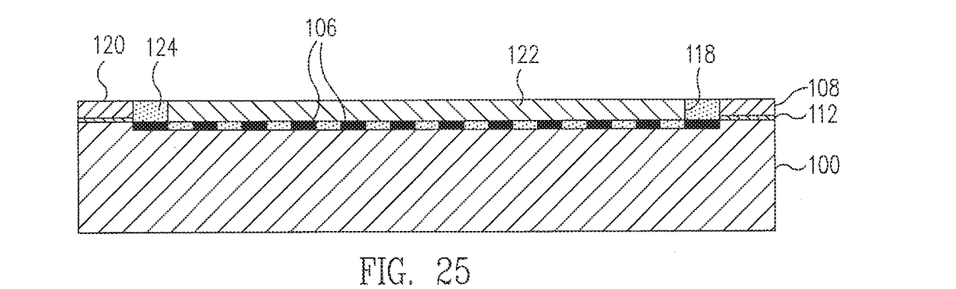
FIG. 25 is a cross-sectional view of the substrates and die of FIG. 24, shown after a planarization process for making top surfaces of the substrate, the die and a dielectric material disposed within the cavity coplanar with each other, for and reducing IC package thickness.

As illustrated in FIG. 24, after the first die 118 has been attached to the first substrate 100, an etching process can be carried out simultaneously on top surfaces 120 and 122 of the second substrate 108 and the die 118 to reduce the thickness of the end IC package. As illustrated in FIG. 25, after the second substrate 108 and the die 118 have been thinned down to the desired thickness, the first cavity 116 can be filled with a dielectric bonding material 124, e.g., an epoxy resin, to support and protect the die 118 within the first cavity 116 in a robust fashion. As discussed above, the cavity 116 may also be at least partially filled with an inorganic material, such as an oxide layer, to better match the effective CTE of the filled cavity to those of the die 118 and substrates 100 and 108.

Figure 26:
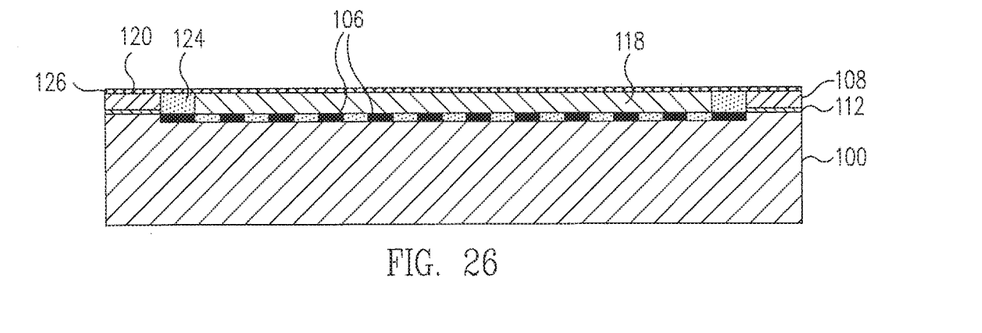
FIG. 26 is a cross-sectional view of the substrates, die and dielectric material of FIG. 25, showing a layer of a bonding material deposited onto the planarized top surfaces thereof.

As illustrated in FIG. 25, the respective top surfaces of the second substrate 108, the die 118 and the bonding material 124 can then be planarized using, e.g., a CMP process, such that the top surfaces of the second substrate 108, the first die 118 and the bonding material 124 disposed within the first cavity 116 are disposed coplanar with each other. Following this step, a layer 126 of a bonding material can be deposited onto the planarized surface, as illustrated in FIG. 26. As above, the bonding material can comprise, for example, a layer of an oxide, e.g., SiO2, a metal, Benzocyclobutene (BCB), a thermal interface material (TIM), an adhesive, glass frit, or the like.

Figure 27:
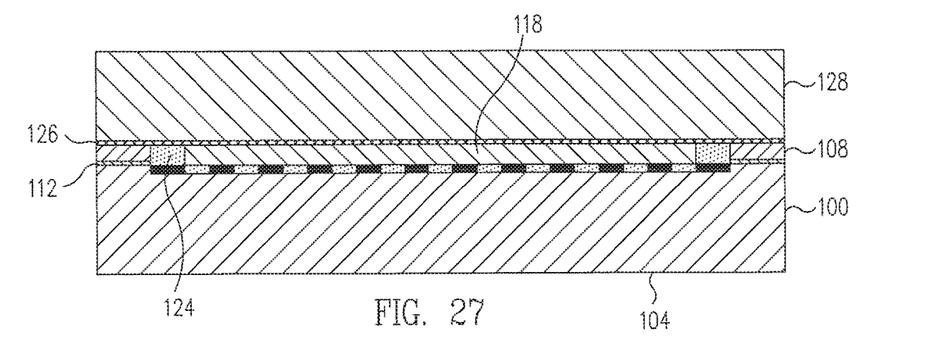
FIG. 27 is a cross-sectional view of the substrates and die of FIG. 26, showing a third substrate having a bottom surface sealingly attached to at least the top surface of the second substrate.

As illustrated in FIG. 27, a bottom surface of a third substrate 128, e.g., comprising a portion of a third or "cover" wafer comprising, e.g., silicon, can then be bonded to the planarized top surfaces of at least the second substrate 108, and in some embodiments, the first die 118 and the bonding material 124, using the layer 26 of bonding material. As above, depending on the application at hand, the bonding method used can comprise a wide range of known wafer bonding techniques.

And as above, the third substrate 128 need not necessarily comprise a portion of a third wafer. Thus, in an alternative embodiment, the layer 126 of bonding material can be omitted, and the third substrate 128 can instead comprise a layer of glass, a polymer, e.g., an epoxy resin, or a metal that is molded, formed or bonded over the planarized top surfaces of the second substrate 108, first die 20, and the bonding material 124.

Figure 28:
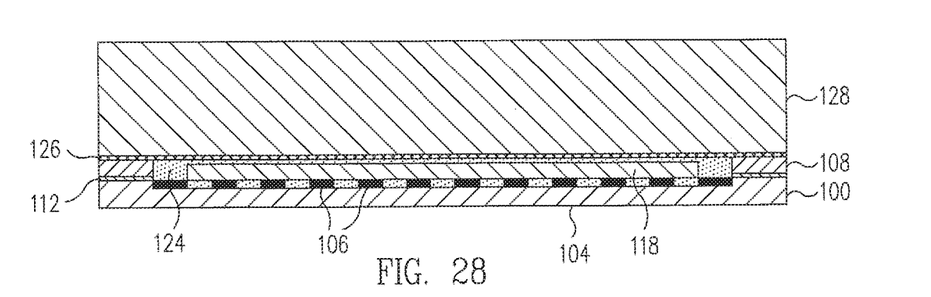
FIG. 28 is a cross-sectional view of the substrates and die of FIG. 27, shown after the application of a thinning process to a back side surface of the first substrate for reducing IC package thickness.
Figure 29:
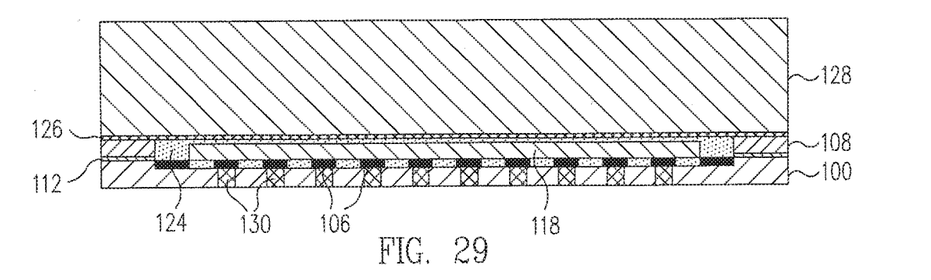
FIG. 29 is a cross-sectional view of the substrates and die of FIG. 28, showing a plurality of electroconductive elements penetrating through the first substrate and having upper ends coupled to selected ones of the electroconductive contacts on the floor of the cavity; and, FIG. 30 is a cross-sectional view of the substrates and die of FIG. 29, showing an electroconductive redistribution layer (RDL) disposed on the back side surface of the first substrate and a plurality of electroconductive solder bumps respectively coupled to lower ends of selected ones of the electroconductive elements.
Figure 30:
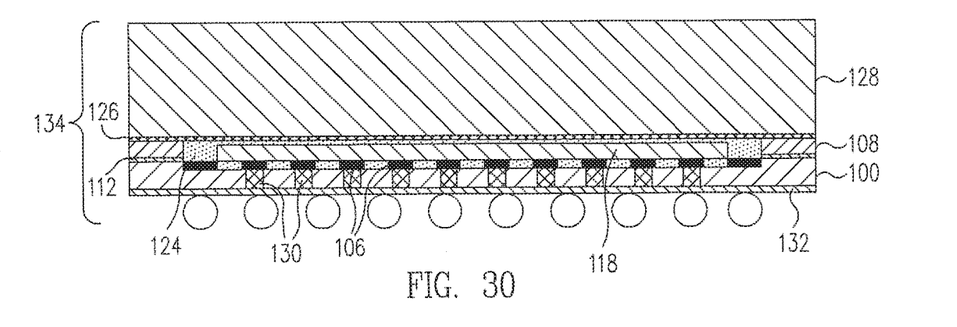

As illustrated in FIG. 28, a thinning process, e.g., a CMP process, can then be applied to the back side surface 104 of the first substrate 100 for a further reduction in end IC package thickness. As above, this can effected in part by clamping a top surface of the third substrate 128 to a conventional vacuum or electrostatic wafer chuck. After the back side thinning process, a plurality of first electroconductive elements 130 can be formed in the back side surface 104. As illustrated in FIG. 30, the first electroconductive elements 130 can comprise, e.g., via-last-process TSVs, that penetrate through the first substrate 100 and have upper ends coupled to selected ones of the electroconductive contacts 106 disposed on the front side surface 102 of the first die 100.

If no other thinning processes are to be applied, then as illustrated in FIG. 30, the method can continue with the formation of under-bump metallizations (UBMs) on the back side surface 104 of the first substrate 100, which can include the formation of a patterned electroconductive redistribution layer (RDL) 132 thereon, followed by the formation of a plurality of electroconductive solder bumps 36 respectively coupled to corresponding ones of the UMBs and/or the RDL 132. The UMBs and/or the RDL 132 selectively interconnect lower ends of the electroconductive elements 106, the UMBs and/or the RDL 132 to each other, and can be effected using the same materials and processes used to form the back side surface RDL 34 of the first embodiment discussed above in connection with FIG. 15. FIG. 30 illustrates an example embodiment of a 2D IC package 134 resulting after its singulation from the wafer sandwich.

As those of some skill will recognize, except for the "window frame" second substrate 108 used to define the first cavity 116, the 2D IC package 134 of FIG. 30 is substantially similar to the 2D IC package 38 discussed above in connection with FIG. 11. Thus, all of the same materials and processes used to reduce end IC package thickness, form alternative or additional RDLs and/or to assemble 3D IC packages using single and/or plural first and second dies discussed above in connection with FIGS. 12-19B can be used identically in connection with the embodiment of FIG. 30, and accordingly, further detailed description of these alternative embodiments is omitted for the sake of brevity.

In light of the foregoing detailed description, it should be clear to those of some skill in this art that many modifications, substitutions and variations can be made in and to the methods and materials of the IC packages with integrated ITPs of the present disclosure, and accordingly, that the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A method for making an integrated circuit (IC) package, the method comprising:
   providing a first substrate having a back side surface, a top surface and a cavity disposed in the top surface, the cavity having a floor defining a front side surface;
   forming electroconductive contacts on respective ones of the front and back side surfaces;
   forming a plurality of electroconductive elements penetrating through the first substrate and interconnecting selected ones of the electroconductive contacts respectively disposed on the front and back side surfaces to each other;
   obtaining one or more first dies, and electroconductively coupling each first die to corresponding ones of the electroconductive contacts disposed on the front side surface, each first die containing an IC;
   permanently sealingly attaching a bottom surface of a second substrate to the top surface of the first substrate;
   before the attaching of the bottom surface of the second substrate to the top surface of the first substrate, processing a top surface of at least one first die to reduce a final thickness of the IC package;
   after said permanently sealingly attaching the bottom surface of the second substrate to the top surface of the first substrate, applying a thinning process to the back side surface of the first substrate to further reduce the final thickness of the IC package.

2. The method of claim 1 wherein the processing of the top surface of the at least one first die comprises etching the top surface of the at least one first die.

3. The method of claim 1 wherein the processing of the top surface of the at least one first die comprises mechanical polishing of the top surface of the at least one first die.

4. The method of claim 1 wherein the processing of the top surface of the at least one first die comprises chemical mechanical polishing of the top surface of the at least one first die.

5. The method of claim 1 further comprising processing the top surface of the first substrate during the processing of the top surface of the at least one first die, the processing of the top surface of the first substrate being to reduce the final thickness of the IC package.

6. The method of claim 5 wherein the processing of the top surface of at least one first die and the processing of the top surface of the first substrate comprise grinding the top surfaces of the at least one first die and the first substrate to make them coplanar with each other and to reduce a final thickness of the IC package.

7. The method of claim 1 wherein the plurality of electroconductive elements penetrating through the first substrate are formed after applying the thinning process.

8. The method of claim 7 wherein forming the plurality of electroconductive elements comprises:
forming through-holes in the back side surface of the first substrate; and
forming electroconductive material in the through-holes.

9. The method of claim 1 wherein forming the plurality of electroconductive elements comprises:
providing the electroconductive elements before said permanently sealingly attaching the bottom surface of the second substrate to the top surface of the first substrate; and
revealing the electroconductive elements by the thinning process.

10. The method of claim 1 wherein each said electroconductive contact formed on the back side surface is formed after said permanently sealingly attaching the bottom surface of the second substrate to the top surface of the first substrate.

11. The method of claim 1 wherein each said electroconductive contact formed on the back side surface is formed after said thinning process.

12. The method of claim 1 further comprising permanently sealingly attaching the bottom surface of the first substrate to a top surface of at least one first die.

13. A method for making an integrated circuit (IC) package, the method comprising:
providing a first substrate having a back side surface, a top surface and a cavity disposed in the top surface, the cavity having a floor defining a front side surface;
forming a plurality of first electroconductive contacts on the front side surface;
obtaining one or more first dies, and electroconductively coupling each first die to corresponding ones of the first electroconductive contacts, each first die containing an IC;
after said electroconductively coupling each first die, processing a top surface of at least one first die to reduce a final thickness of the IC package;
permanently sealingly attaching a bottom surface of a second substrate to the top surface of the first substrate; and
after said permanently sealingly attaching the bottom surface of the second substrate to the top surface of the first substrate, forming a plurality of second electroconductive contacts on the back side surface and a plurality of electroconductive elements penetrating through the first substrate and interconnecting selected ones of the first electroconductive contacts and the second electroconductive contacts to each other;
wherein forming a plurality of the second electroconductive contacts and a plurality of electroconductive elements comprises:
forming a plurality of through-holes in the first substrate; and
forming the electroconductive elements in the through-holes.

14. The method of claim 13 further comprising permanently sealingly attaching the bottom surface of the first substrate to a top surface of at least one first die.

15. A method for making an integrated circuit (IC) package, the method comprising:
providing a first substrate having a back side surface, a top surface and a cavity disposed in the top surface, the cavity having a floor defining a front side surface;
forming electroconductive contacts on respective ones of the front and back side surfaces;
forming a plurality of electroconductive elements penetrating through the first substrate and interconnecting selected ones of the electroconductive contacts respectively disposed on the front and back side surfaces to each other;
obtaining one or more first dies, and electroconductively coupling each first die to corresponding ones of the first electroconductive contacts, each first die containing an IC;
after said electroconductively coupling each first die, processing a top surface of at least one first die to reduce a final thickness of the IC package;
permanently sealingly attaching a bottom surface of a second substrate to a top surface of at least one first die, the bottom surface of the second substrate covering the cavity; and
after said permanently sealingly attaching the bottom surface of the second substrate to the top surface of at least one first die, applying a thinning process to the back side surface of the first substrate to further reduce the final thickness of the IC package.

16. The method of claim 15 wherein the plurality of electroconductive elements penetrating through the first substrate are formed after applying the thinning process.

17. The method of claim 16 wherein forming the plurality of electroconductive elements comprises:
forming through-holes in the back side surface of the first substrate; and
forming electroconductive material in the through-holes.

18. The method of claim 15 wherein forming the plurality of electroconductive elements comprises:
providing the electroconductive elements before said permanently sealingly attaching the bottom surface of the second substrate to the top surface of the first substrate; and
revealing the electroconductive elements by the thinning process.

19. The method of claim 15 wherein each said electroconductive contact formed on the back side surface is formed after said permanently sealingly attaching the bottom surface of the second substrate to the top surface of the first substrate.

20. The method of claim 15 wherein each said electroconductive contact formed on the back side surface is formed after said thinning process.

* * * * *